(12) United States Patent
Otabe et al.

(10) Patent No.: US 11,099,227 B2
(45) Date of Patent: Aug. 24, 2021

(54) MULTILAYER WIRING BASE PLATE AND PROBE CARD USING THE SAME

(71) Applicant: Kabushiki Kaisha Nihon Micronics, Tokyo (JP)

(72) Inventors: Noboru Otabe, Tokyo (JP); Yoshiyuki Fukami, Ibaraki (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 400 days.

(21) Appl. No.: 16/097,757

(22) PCT Filed: Apr. 6, 2017

(86) PCT No.: PCT/JP2017/014387
§ 371 (c)(1),
(2) Date: Oct. 30, 2018

(87) PCT Pub. No.: WO2017/191726
PCT Pub. Date: Nov. 9, 2017

(65) Prior Publication Data
US 2020/0400739 A1    Dec. 24, 2020

(30) Foreign Application Priority Data

May 6, 2016  (JP) .............................. JP2016-093025

(51) Int. Cl.
*G01R 31/28* (2006.01)
*G01R 1/073* (2006.01)
(Continued)

(52) U.S. Cl.
CPC ......... *G01R 31/2818* (2013.01); *G01R 1/073* (2013.01); *H05K 1/0266* (2013.01);
(Continued)

(58) Field of Classification Search
CPC .... G01R 31/2818; G01R 1/073; G01R 31/26; H05K 1/0266; H05K 1/167; H05K 2201/0317; H05K 2201/068
(Continued)

(56) References Cited

U.S. PATENT DOCUMENTS 5,886,877 A    3/1999  Shingai et al.
7,735,221 B2   6/2010  Inoue et al.
(Continued)

FOREIGN PATENT DOCUMENTS

CN        103796420 A      5/2014
CN        201610205793   *  4/2016
(Continued)

*Primary Examiner* — Farhana A Hoque
(74) *Attorney, Agent, or Firm* — Lorenz & Kopf, LLP

(57) ABSTRACT

Included are an insulating plate 41 including a plurality of insulating synthetic resin layers, wiring circuits 44a, 44b, and 44c provided in the insulating plate 41, a thin-film resistor 46 formed to be buried in the insulating plate 41 and electrically connected to the wiring circuits 44a, 44b, and 44c, a heat dissipating portion 47 provided over one surface of the insulating plate to be opposed to the thin-film resistor 46 via a part of the plurality of insulating synthetic resin layers and having higher heat conductivity than that of the insulating plate 41, a pedestal portion 48 formed to be buried in the insulating plate 41 and provided to be opposed to the thin-film resistor 46 via a part of the plurality of insulating synthetic resin layers on an opposite side of the heat dissipating portion 47 and having higher heat conductivity than that of the insulating plate 41, and a heat dissipation and pedestal connecting portion 49 connecting the heat dissipating portion 47 to the pedestal portion 48 and having higher heat conductivity than that of the insulating plate 41.

12 Claims, 8 Drawing Sheets

(51) Int. Cl.
*H05K 1/02* (2006.01)
*H05K 1/16* (2006.01)

(52) U.S. Cl.
CPC ..... *H05K 1/167* (2013.01); *H05K 2201/0317* (2013.01); *H05K 2201/068* (2013.01)

(58) Field of Classification Search
USPC .................................................. 324/754.01
See application file for complete search history.

(56) References Cited

U.S. PATENT DOCUMENTS

| | | | |
|---|---|---|---|
| 8,299,812 | B2 | 10/2012 | Nitta et al. |
| 9,271,393 | B2 | 2/2016 | Otabe et al. |
| 2014/0118017 | A1* | 5/2014 | Otabe ............... H05K 1/167 |
| | | | 324/756.03 |

FOREIGN PATENT DOCUMENTS

| | | |
|---|---|---|
| JP | H0722484 A | 1/1995 |
| JP | H09330995 A | 12/1997 |
| JP | H10197561 A | 7/1998 |
| JP | 2008145238 A | 6/2008 |
| JP | 2008172173 A | 7/2008 |
| JP | 2008283131 A | 11/2008 |
| JP | 2010151497 A | 7/2010 |
| JP | 2014089089 A | 5/2014 |
| KR | 20140055957 A | 5/2014 |

* cited by examiner (a)

(b)

(a)

(b)

(a)

(b)

(a)

(b)

MULTILAYER WIRING BASE PLATE AND PROBE CARD USING THE SAME

TECHNICAL FIELD

The present invention relates to a multilayer wiring base plate interposed on an electrical path between a device under test and a tester to transmit a signal required for a test and incorporating a thin-film resistor and a probe card using the multilayer wiring base plate.

BACKGROUND ART

Semiconductor integrated circuits (hereinbelow referred to as "wafer chips" as well) collectively formed on a semiconductor wafer (hereinbelow referred to simply as "a wafer" as well) undergo an electrical test (for example, a wafer test) with use of a tester apparatus (hereinbelow referred to as "a tester" as well) before being separated into respective chips. In general, for this electrical test is used a probe card interposed between the tester and each of the wafer chips serving as a device under test to transmit a test signal, a response output, and the like between the tester and the device under test. Respective probes of the probe card connected to the tester are brought in contact with corresponding electrode pads of the device under test to cause the device under test to be connected to the tester for the electrical test (for example, refer to Patent Literature 1).

In such a probe card, a multilayer wiring base plate is used as a probe base plate, and multiple probes are arranged on one surface of the probe base plate. Also, in a wiring circuit incorporated in this probe base plate or multilayer wiring base plate, an electrical resistor is incorporated for the purpose of electrical matching such as impedance matching or for the purpose of control of supply power to the respective probes.

To incorporate the resistor in such a multilayer wiring base plate, a thin-film resistor is buried and formed in a synthetic resin layer made of an electrical insulating material serving as a base material for the wiring base plate (for example, refer to Patent Literature 2).

In a case in which the electrical test of the respective devices under test formed on the wafer is performed with use of the probe card including the thin-film resistor buried and formed in the synthetic resin layer, heat in accordance with the wattage is generated in the thin-film resistor as a flowing current value is increased. Since the thin-film resistor is made of a metal material having a smaller linear expansion coefficient than that of the synthetic resin layer made of the electrical insulating material, the thin-film resistor results in receiving stresses repeatedly at a border with the synthetic resin layer in accordance with a difference in the linear expansion coefficient between the thin-film resistor and the synthetic resin layer to which the thin-film resistor is fixed. Such repeated stresses caused by the temperature changes may accelerate deterioration of the thin-film resistor and cause breakage.

Under such circumstances, proposed is a technique in which a heat expansion and contraction restricting layer having a small linear expansion coefficient is formed to be buried in a synthetic resin layer adjacent to a synthetic resin layer in which a thin-film resistor is formed to be buried, so that the heat expansion and contraction restricting layer may go along the thin-film resistor, to improve durability (for example, refer to Patent Literature 3).

CITATION LIST

Patent Literature

Patent Literature 1: JP 2010-151497 A
Patent Literature 2: JP 2008-283131 A
Patent Literature 3: JP 2014-89089 A

SUMMARY OF INVENTION

Technical Problem

By forming the heat expansion and contraction restricting layer as described in Patent Literature 3, a heat expansion and contraction difference between the thin-film resistor and the synthetic resin layer can be restricted to some extent. However, since heat conductivity of the electrical insulating material forming the synthetic resin layer is lower than that of the conductive material forming the thin-film resistor, heat generated by the thin-film resistor will accumulate in the insulating material.

When the temperature of the insulating material increases and exceeds a heat-resistant temperature, heat destruction will occur, and the electrical test cannot be conducted in some cases.

Also, even in a case in which the temperature does not reach the heat-resistant temperature of the insulating material, deterioration of the thin-film resistor will progress, which may cause breakage, when the thin-film resistor repeatedly receives excessive stresses due to influences of expansion caused by heating and contraction caused by cooling.

An object of the present invention is to efficiently dissipate heat generated from a thin-film resistor in a multilayer wiring base plate in which the thin-film resistor is buried and formed in a synthetic resin layer made of an electrical insulating material.

Solution to Problem

A first aspect of a multilayer wiring base plate according to the present invention is a multilayer wiring base plate provided on a wiring path between a tester and a probe, including an insulating plate including a plurality of insulating synthetic resin layers, a wiring circuit provided in the insulating plate, at least one thin-film resistor formed to be buried in the insulating plate and electrically connected to the wiring circuit, a heat dissipating portion provided over one surface of the insulating plate to be opposed to the thin-film resistor via a part of the plurality of insulating synthetic resin layers and having higher heat conductivity than that of the insulating plate, a pedestal portion formed to be buried in the insulating plate and provided to be opposed to the thin-film resistor via a part of the plurality of insulating synthetic resin layers on an opposite side of the heat dissipating portion and having higher heat conductivity than that of the insulating plate, and at least one heat dissipation and pedestal connecting portion connecting the heat dissipating portion to the pedestal portion on a lateral side of the thin-film resistor, provided to be buried in the insulating plate, and having higher heat conductivity than that of the insulating plate.

As a second aspect of the multilayer wiring base plate according to the present invention, the heat dissipation and pedestal connecting portion is provided along a longitudinal direction of the thin-film resistor.

As a third aspect of the multilayer wiring base plate according to the present invention, the plurality of heat dissipation and pedestal connecting portions are provided on both lateral sides of the thin-film resistor with the thin-film resistor interposed therebetween.

As a fourth aspect of the multilayer wiring base plate according to the present invention, the plurality of heat dissipation and pedestal connecting portions provided at least on one lateral side of the thin-film resistor are connected.

As a fifth aspect of the multilayer wiring base plate according to the present invention, the multilayer wiring base plate further includes paired connecting electrodes connected to both ends of the thin-film resistor and provided to at least partially project from the insulating plate, and insulating protecting layers provided to cover at least parts of the paired connecting electrodes projecting from the insulating plate, and the heat dissipating portion is provided to cover the insulating protecting layers and a surface of the insulating plate located between the insulating protecting layers without contacting the paired connecting electrodes.

As a sixth aspect of the multilayer wiring base plate according to the present invention, the multilayer wiring base plate further includes paired connecting electrodes connected to both ends of the thin-film resistor and provided to at least partially project from the insulating plate, and an insulating protecting layer provided to cover at least a part of each of the paired connecting electrodes projecting from the insulating plate and a surface of the insulating plate located between the paired connecting electrodes, and the heat dissipating portion is provided to cover the insulating protecting layer without contacting the paired connecting electrodes.

As a seventh aspect of the multilayer wiring base plate according to the present invention, the plurality of thin-film resistors are provided, the heat dissipating portion is provided to be opposed to the plurality of thin-film resistors, and the heat dissipating portion and the pedestal portion are connected by the plurality of heat dissipation and pedestal connecting portions.

A first aspect of a probe card according to the present invention is a probe card including the multilayer wiring base plate according to any one of the aforementioned first to seventh aspects.

Advantageous Effects of Invention

According to the present invention, in a multilayer wiring base plate incorporating a thin-film resistor, heat generated from the thin-film resistor can be dissipated efficiently.

BRIEF DESCRIPTION OF DRAWINGS

FIG. 3(a) illustrates a process for forming a pedestal portion 48 on a first synthetic resin layer 42a, FIG. 3(b) illustrates a process for forming a second synthetic resin layer 42b covering the pedestal portion 48, FIG. 3(c) illustrates a process for forming a thin-film resistor 46 on the second synthetic resin layer 42b, FIG. 3(d) illustrates a process for forming a third synthetic resin layer 42c, FIG. 3(e) illustrates a process for forming a pair of connecting electrodes 44c, FIG. 3(f) illustrates a process for forming insulating protecting layers 45, and FIG. 3(g) illustrates a process for forming a heat dissipating portion 47.

DESCRIPTION OF EMBODIMENTS

Hereinbelow, a probe card according to an embodiment of the present invention will be described in detail with reference to the drawings.

Figure 1:
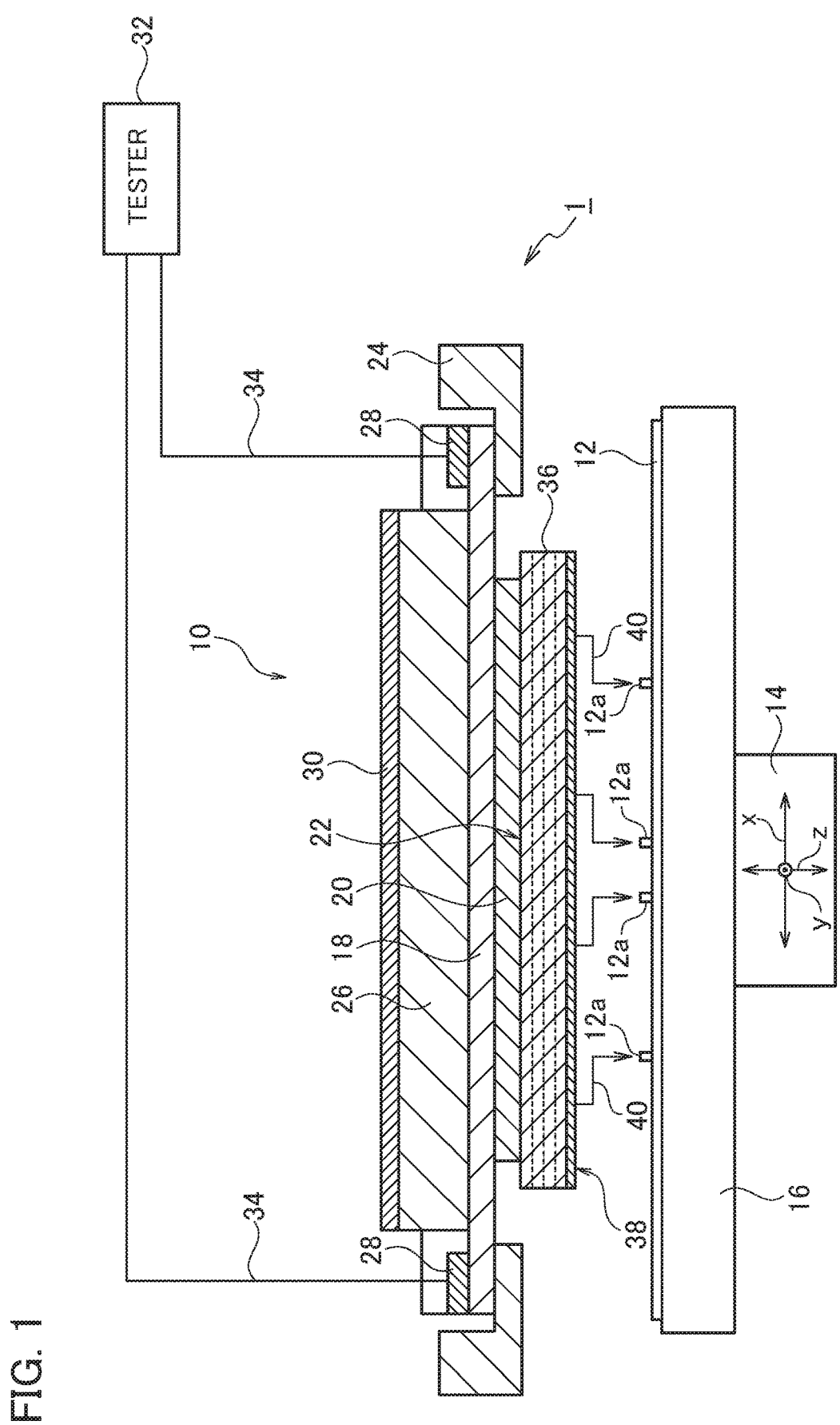
FIG. 1 is a schematic cross-sectional view illustrating a test system using a probe card according to an embodiment of the present invention.

FIG. 1 is a schematic cross-sectional view illustrating an overall structure of a test system incorporating a probe card according to an embodiment of the present invention.

A test system 1 incorporating a probe card 10 according to the embodiment of the present invention illustrated in FIG. 1 is used in an electrical test of multiple wafer chips (not illustrated) serving as IC circuits formed on a wafer 12. One surface of the wafer 12 is provided with multiple electrodes 12a for the respective wafer chips. The test system 1 performs an electrical test of the respective wafer chips by bringing probes 40 provided on the probe card 10 into contact with these electrodes 12a at once or in several batches to apply a signal and the like required for a test.

The test system 1 includes a wafer prober (hereinbelow referred to simply as "a prober") movably holding the wafer 12 serving as a device under test, an electrical connecting apparatus or the probe card 10 including a plurality of probes 40, and a tester 32 connected to the device under test via the probe card 10, applying a signal, voltage, and the like required for the test to the device under test, and evaluating a response characteristic and the like of the device under test.

The prober includes a support table 16 holding the wafer 12 and a support mechanism 14 movably supporting the support table 16.

The support table 16 is a table including a chuck mechanism (for example, a vacuum chuck) adapted to removably hold the wafer 12 in a state in which the electrodes 12a of the multiple wafer chips of the wafer 12 face upward.

The support mechanism 14 is a mechanism movably supporting the support table 16 holding the wafer 12 and can be the support mechanism 14 serving as an xyzθ mechanism, for example. The support mechanism 14 serving as the xyzθ mechanism can move the support table 16 along an x axis and a y axis on a horizontal plane (xy plane) perpendicular to a vertical axis (z axis), move the support table 16 in an up-down direction along the vertical axis (z axis), and rotate the support table 16 over the horizontal plane (xy plane) around the vertical axis. This controls a position and a posture of the wafer 12 with respect to the probe card 10.

The probe card 10 includes a plurality of connectors 28 configured to be electrically connected to the tester 32, the plurality of probes 40 configured to contact the electrodes 12a of the wafer chips, and a wiring circuit configured to connect the connectors 28 to the probes 40. The probe card 10 includes an entirely circular flat-plate-like wiring base plate 18 (for example, a rigid wiring base plate) formed with use of an electrical insulating resin such as a glass-containing epoxy resin material as a base material, a flat-plate-like electrical connector 20 fixed on a lower surface of the wiring base plate 18, and a probe base plate 22 fixed on a lower surface of the electrical connector 20. In the example illustrated in FIG. 1, the probe card 10 also includes a reinforcing member 26 fixed on an upper surface of the wiring base plate 18 and a circular-plate-like cover 30 attached to an upper side of the reinforcing member 26. These members 18, 20, 22, 26, and 30 are firmly assembled by not-illustrated fastening tools such as a plurality of bolts. The probe card 10 may be configured to dispense with the reinforcing member 26 and the cover 30.

The wiring base plate 18 is provided at an annular circumferential edge portion on the upper surface thereof with the multiple connectors 28 removably connected via wiring paths 34 to a not-illustrated test head of the tester 32. The respective connectors 28 function as connecting ends of the probe card 10 to the tester 32. The wiring base plate 18 also includes a wiring circuit including wiring paths connected to the connectors 28 and leading to the lower surface side. The wiring base plate 18 is supported with the edge portion thereof mounted on an annular card holder 24 provided on a frame of the test head of the tester 32 or a frame of the prober.

The electrical connector 20 is a board electrically connecting the wiring base plate 18 to the probe base plate 22 and can be an electrical connector including pogo pins, for example. As is conventionally known, the electrical connector 20 mutually electrically connects the wiring paths of the wiring circuit of the wiring base plate 18 to wiring paths of a below-mentioned wiring circuit of the probe base plate 22 corresponding to the wiring paths of the wiring base plate 18.

In the example illustrated in FIG. 1, the probe base plate 22 includes a ceramic plate 36 fixed on a lower surface of the electrical connector 20 and a multilayer wiring base plate 38 fixed on a lower surface of the ceramic plate 36.

The ceramic plate 36 is provided with wiring paths (not illustrated) corresponding to the respective wiring paths of the wiring circuit of the wiring base plate 18. An upper surface of the ceramic plate 36 is coupled with the lower surface of the electrical connector 20 so that the wiring paths of the wiring base plate 18 may mutually be connected to the corresponding wiring paths of the ceramic plate 36 via the electrical connector 20.

Also, the multilayer wiring base plate 38 is provided with a wiring circuit (not illustrated) including wiring paths corresponding to the wiring paths of the ceramic plate 36. An upper surface of the multilayer wiring base plate 38 is coupled with the lower surface of the ceramic plate 36 so that the wiring paths of the ceramic plate 36 may mutually be connected to the corresponding wiring paths of the multilayer wiring base plate 38.

As is conventionally well-known, a lower surface of the multilayer wiring base plate 38 is provided with the multiple probes 40 connected to the corresponding wiring paths of the multilayer wiring base plate 38 and connectable to the corresponding electrodes 12a of the wafer 12. The probes 40 and the wiring paths are connected via not-illustrated probe pads formed on the lower surface of the multilayer wiring base plate 38 by deposition of a wiring metal material. The probe pads are connected to the corresponding wiring paths, and the probes 40 are fixed to the probe pads.

As the probe 40 can be used a conventionally known probe such as a cantilever probe, a plate-like probe manufactured with use of a photolithographic technique and a deposition technique, and a probe provided on one surface of an electrical insulating sheet with a plurality of interconnection lines and using a part of the interconnection lines as a contactor.

The reinforcing member 26 is made of a metal material such as a stainless steel plate and includes a flat lower surface to be coupled with the upper surface of the wiring base plate 18. The reinforcing member 26 is formed to include a plurality of spaces opened both upward and downward and can be formed to include a plurality of annular portions formed concentrically and having different diameters, a coupling portion coupling these annular portions with each other in a radial direction, and an extending portion extending outward in the radial direction from the outermost annular portion, as described in JP 2008-145238 A, for example.

Similarly to a conventional case, in the probe card 10 according to the present invention, when the respective probes 40 are connected to the corresponding electrodes 12a of the wafer 12, the respective probes 40 are connected to the tester 32 via the corresponding wiring paths of the multilayer wiring base plate 38, the ceramic plate 36, the electrical connector 20, and the wiring base plate 18. Under this connection condition, required electrical signals, power supply voltage, and the like are supplied from the tester 32 via the predetermined probes 40 to the respective wafer chips of the wafer, and response signals are returned from the respective wafer chips via the predetermined probes 40 to the tester 32. Through the signal interaction, the respective wafer chips of the wafer 12 undergo electrical tests.

Next, the details of the multilayer wiring base plate 38 included in the probe card 10 according to the embodiment of the present invention will be described.

Figure 2:
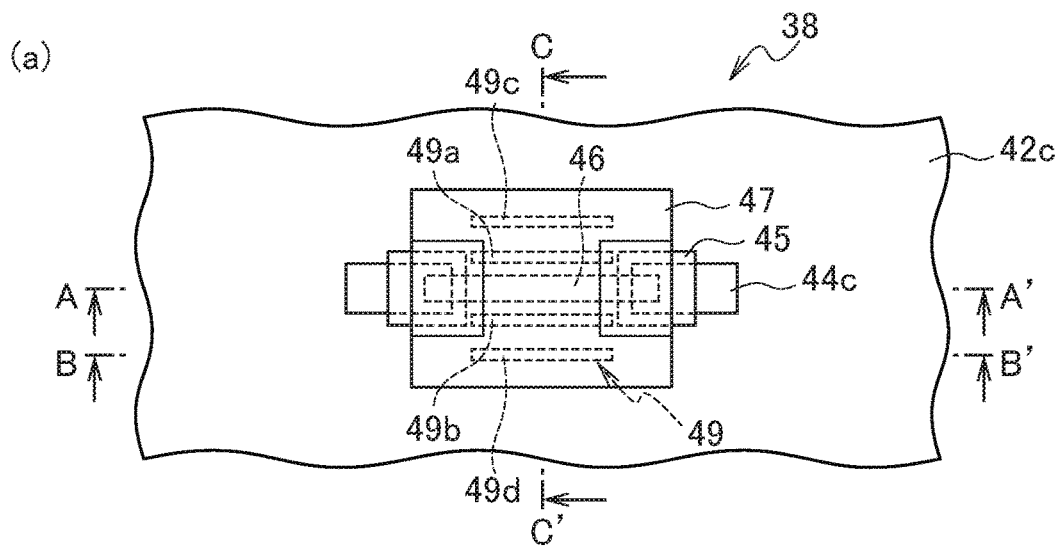
FIG. 2(a) is a partial plan view of a multilayer wiring base plate included in the probe card according to the embodiment of the present invention.
FIG. 2(b) is a partial cross-sectional view cut along the cross-section A-A' in FIG. 2(a)
FIG. 2(c) is a partial cross-sectional view cut along the cross-section B-B' in FIG. 2(a)
FIG. 2(d) is a partial cross-sectional view cut along the cross-section C-C' in FIG. 2(a).
Figure 2:
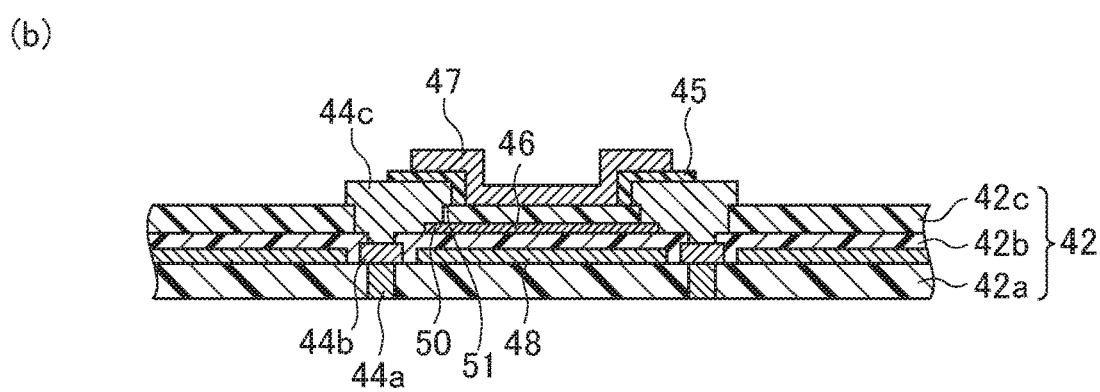
Figure 2:
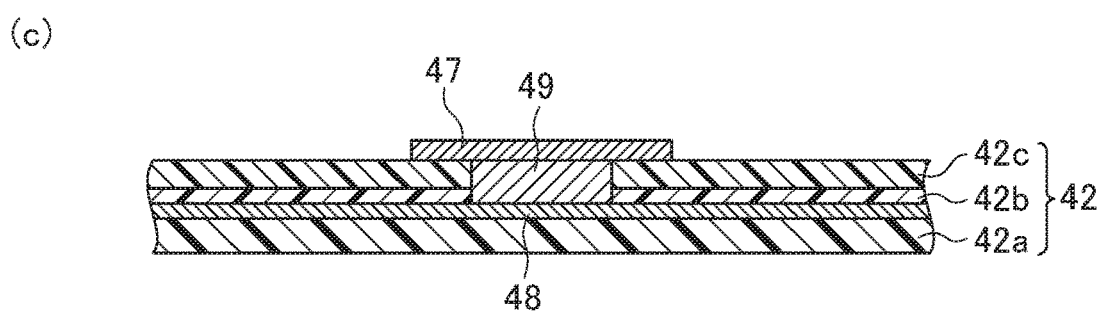
Figure 2:
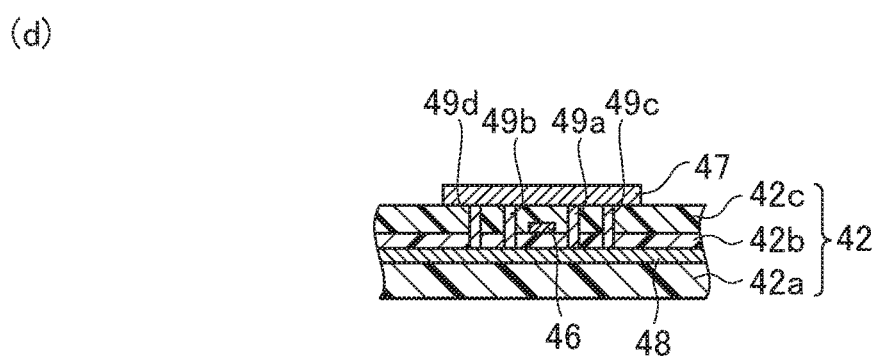

The multilayer wiring base plate 38 is a multilayered wiring base plate using an electrical insulating material such as a polyimide synthetic resin material as a base material and includes a thin-film resistor 46 and a structure dissipating heat from the thin-film resistor 46 (a pedestal portion 48, a heat dissipating portion 47, and heat dissipation and pedestal connecting portions 49). FIG. 2 illustrates the multilayer wiring base plate 38 illustrated in FIG. 1 so that the posture thereof may be upside down to correspond to FIG. 3, which illustrates a below-mentioned manufacturing process for the multilayer wiring base plate 38. For this reason, the multilayer wiring base plate 38 will be described below (with use of FIGS. 2 to 9) with the lower side in FIG. 1 regarded as the upper side. Also, in the description of the embodiment of the present invention, although one thin-film resistor 46 and a structure of a peripheral part thereof is illustrated in the figures and described, a plurality of structures can be provided in one multilayer wiring base plate 38 (the same is true for Modification Examples 1 to 5).

FIG. 2(a) is a plan view illustrating one thin-film resistor 46 and a heat dissipating structure part of the multilayer wiring base plate 38 included in the probe card 10 according to the embodiment of the present invention, FIG. 2(b) is a cross-sectional view illustrating the thin-film resistor 46 and the heat dissipating structure part when the multilayer wiring base plate 38 is cut along the cross-section A-A' in FIG. 2(a), FIG. 2(c) is a cross-sectional view illustrating the thin-film resistor 46 and the heat dissipating structure part when the multilayer wiring base plate 38 is cut along the cross-section B-B' in FIG. 2(a), and FIG. 2(d) is a cross-sectional view illustrating the thin-film resistor 46 and the heat dissipating structure part when the multilayer wiring base plate 38 is cut along the cross-section C-C' in FIG. 2(a).

The multilayer wiring base plate 38 is provided on the ceramic plate 36 and includes an insulating plate 41 serving as a laminated structure body of a plurality of insulating layers. Each of the insulating layers included in the insulating plate 41 is made of an electrical insulating material such as a polyimide synthetic resin material or the electrical insulating material provided with AlN (aluminum nitride), BN (boron nitride), or the like as a filler to increase heat conductivity, and the adjacent layers are formed to be fixed to each other. Between the respective insulating layers and on the surfaces of the outermost layers (the uppermost layer and the lowermost layer), the wiring paths constituting the wiring circuit of the multilayer wiring base plate 38 are formed as needed, as is conventionally well-known.

Among the insulating layers included in the insulating plate 41, a layer in which the thin-film resistor 46, the pedestal portion 48, and the heat dissipation and pedestal connecting portions 49 are buried will be referred to as a heat dissipating structure burying layer 42.

The cross-sectional views illustrated in FIGS. 2(b) to 2(d) illustrate only the heat dissipating structure burying layer 42 and the upper part and omit a part lower than the heat dissipating structure burying layer 42, that is, a part located between the heat dissipating structure burying layer 42 and the ceramic plate 36. The same is true for the cross-sectional views illustrated in FIGS. 4(b), 5(b), 6(b), and 7(b).

In the embodiment of the present invention, the heat dissipating structure burying layer 42 includes three layers ranging from a first synthetic resin layer 42a located in the lowermost layer as seen in FIG. 2 to a second synthetic resin layer 42b and a third synthetic resin layer 42c.

The first synthetic resin layer 42a, the second synthetic resin layer 42b, and the third synthetic resin layer 42c can have different compositions or be made of different synthetic resin materials. However, for simplification of description, an example in which the first synthetic resin layer 42a, the second synthetic resin layer 42b, and the third synthetic resin layer 42c are synthetic resin layers having equal compositions, as can be seen in a general multilayer wiring base plate, will be described.

As illustrated in FIG. 2(b), wiring paths formed in the heat dissipating structure burying layer 42 and lending to the thin-film resistor 46, among the wiring paths included in the wiring circuit of the multilayer wiring base plate 38, are a pair of via wiring paths 44a penetrating the first synthetic resin layer 42a in a thickness direction thereof, wiring paths 44b formed on a surface of the first synthetic resin layer 42a facing the second synthetic resin layer 42b, and a pair of connecting electrodes 44c penetrating the third synthetic resin layer 42c in a thickness direction thereof.

Each of the via wiring paths 44a is connected at a lower surface (a surface facing the ceramic plate 36) of the first synthetic resin layer 42a to a corresponding wiring path of an insulating layer located further on a lower side than the lower surface and is connected via the wiring path to a corresponding wiring path of the ceramic plate 36. Each of the via wiring paths 44a is also connected at the upper surface (the surface facing the second synthetic resin layer 42b) of the first synthetic resin layer 42a to the corresponding wiring path 44b and is connected via the wiring path 44b to the corresponding connecting electrode 44c.

The paired connecting electrodes 44c are terminals respectively connected to both ends of the thin-film resistor 46. A lower end side of each connecting electrode 44c enters the second synthetic resin layer 42b and is connected to the wiring path 44b, and an upper end side thereof at least partially projects from the third synthetic resin layer 42c. Since the projecting part is formed to be one size larger in a planar view than the part penetrating the third synthetic resin layer 42c, the projecting part includes on a lower side of an outer circumference thereof a step portion 51 covering the third synthetic resin layer 42c. Due to the step portion 51, the connecting electrode 44c and the third synthetic resin layer 42c can reliably be coupled with each other.

Meanwhile, each of the via wiring paths 44a, each of the wiring paths 44b, and each of the connecting electrodes 44c may respectively be connected to other wiring paths formed between the insulating synthetic resin layers (the first synthetic resin layer 42a, the second synthetic resin layer 42b, and the third synthetic resin layer 42c) included in the heat dissipating structure burying layer and on the lower surface of the first synthetic resin layer 42a and the upper surface of the third synthetic resin layer 42c, as needed.

Also, the paired connecting electrodes 44c can be connected to the wiring circuit so that the wiring path connected to one connecting electrode 44c may be connected to the probe 40 while the wiring path connected to the other connecting electrode 44c may be connected to the tester 32.

Between the paired connecting electrodes 44c, the thin-film resistor 46 is formed to be buried in the second synthetic resin layer 42b and the third synthetic resin layer 42c. For example, the thin-film resistor 46 can be formed on an upper surface of the second synthetic resin layer 42b and can be covered with the third synthetic resin layer 42c. As a result, the thin-film resistor is formed to be buried in the insulating plate 41 along the second synthetic resin layer.

The paired connecting electrodes 44c include on lower sides of mutually opposed inner end sides thereof step portions 50 receiving corresponding end portions of the thin-film resistor 46. Since each of the step portions 50 contacts a surface of the end portion of the thin-film resistor 46 over the entire width of the thin-film resistor 46, the step portion 50 can contact the thin-film resistor 46 with a larger contact area than in a case of contacting only the end surface of the thin-film resistor 46, and the thin-film resistor 46 and the connecting electrode 44c are thus connected mechanically and electrically in a reliable manner.

The thin-film resistor 46 is formed by depositing a material such as an Ni—Cr alloy material on the second synthetic resin layer 42b to have a predetermined thickness as described below and then patterning this deposition material to have a predetermined resistance value.

When a current value flowing in the thin-film resistor 46 is increased, heat in accordance with the wattage is generated in the thin-film resistor 46. Since heat conductivity of the insulating plate 41 made of an electrical insulating material such as a polyimide synthetic resin material is lower than that of the conductive material forming the thin-film resistor 46, heat generated by the thin-film resistor 46 will accumulate in the insulating plate 41.

In a case in which no heat dissipating means dissipating heat accumulating in the insulating plate 41 is provided, the temperature of the insulating plate 41 will increase. When the temperature exceeds a heat-resistant temperature, destruction will occur, and an electrical test cannot be conducted in some cases.

Also, in a case in which the thin-film resistor 46 is made of the Ni—Cr alloy material, for example, the thin-film resistor 46 has a linear expansion coefficient of about 2 to 13 ppm/° C. The thin-film resistor 46 is fixed and formed on the second synthetic resin layer 42b, and the third synthetic resin layer 42c burying the thin-film resistor 46 is fixed and formed to cover the upper surface and the side surfaces of the thin-film resistor 46. The second synthetic resin layer 42b and the third synthetic resin layer 42c surrounding the thin-film resistor 46 have a linear expansion coefficient of about 30 to 60 ppm/° C. in a case in which the second synthetic resin layer 42b and the third synthetic resin layer 42c are polyimide synthetic resin layers or are the polyimide synthetic resin layers provided with a filler or the like, for example.

When the ambient temperature of the probe card 10 changes, large stresses will act on the thin-film resistor 46 at an interface between the thin-film resistor 46 and the second synthetic resin layer 42b or the third synthetic resin layer 42c due to a difference in the linear expansion coefficient between the thin-film resistor 46 and the second synthetic resin layer 42b and the third synthetic resin layer 42c surrounding the thin-film resistor 46. Accordingly, without the heat dissipating means dissipating heat accumulating in the insulating plate 41, even in a case in which the temperature does not reach the heat-resistant temperature of the insulating plate 41, deterioration of the thin-film resistor 46 will progress, which may cause breakage, when the thin-film resistor 46 repeatedly receives excessive stresses due to influences of expansion caused by heating and contraction caused by cooling.

Under such circumstances, the probe card 10 according to the embodiment of the present invention further includes the heat dissipating portion 47, the pedestal portion 48, and the heat dissipation and pedestal connecting portions 49 to dissipate heat accumulating in the insulating plate 41.

Also, to prevent the heat dissipating portion 47 and the connecting electrodes 44c from contacting, insulating protecting layers 45 are provided to cover parts of the paired connecting electrodes 44c projecting upward from the uppermost third synthetic resin layer 42c.

Each of the insulating protecting layers 45 may be made of an electrical insulating material such as a polyimide synthetic resin material in a similar manner to the first synthetic resin layer 42a, the second synthetic resin layer 42b, and the third synthetic resin layer 42c or may be made of a material having improved heat conductivity by adding AlN (aluminum nitride), BN (boron nitride), or the like as a filler to the electrical insulating material.

The heat dissipating portion 47 is an integrally-continuing layer including a part opposed to the thin-film resistor 46 via the third synthetic resin layer 42c and covering the third synthetic resin layer 42c, parts opposed to the connecting electrodes 44c via the insulating protecting layers 45 and covering the insulating protecting layers 45, and a part covering and connected to an upper end of a heat dissipation and pedestal connecting portion 49c. The heat dissipating portion 47 is made of a metal material having high heat conductivity such as Au, Cu, Ni, and Ag.

In the embodiment of the present invention, the heat dissipating portion 47 is formed in a rectangular shape having external sides along a longitudinal direction of the thin-film resistor 46 or a direction between the connecting electrodes 44c (hereinbelow referred to as a resistor longitudinal direction as well) and a direction perpendicular to the resistor longitudinal direction (hereinbelow referred to as a resistor width direction as well) in a planar view. Both the external sides extending in the resistor width direction pass over the insulating protecting layers 45 on the paired connecting electrodes 44c, respectively, and both the external sides extending in the resistor longitudinal direction are located further outside than both the heat dissipation and pedestal connecting portions 49 located furthest outside the thin-film resistor 46, respectively. A case in which both the external sides extending in the resistor width direction of the heat dissipating portion 47 are located further outside than both the ends of the thin-film resistor 46 as illustrated in FIG. 2 is preferable in terms of heat dissipation and heat expansion and contraction restricting performance, and a case in which both the external sides extending in the resistor width direction of the heat dissipating portion 47 are located further inside than both the external sides of the paired insulating protecting layers 45 is preferable in that a short circuit of the connecting electrodes 44c and the heat dissipating portion 47 can be prevented.

In this manner, the insulating protecting layers 45 are provided to cover parts of upper parts of the paired connecting electrodes 44c projecting upward from the uppermost third synthetic resin layer 42c, that is, upper parts of parts located on sides on which the paired connecting electrodes 44c are opposed (parts located on sides on which the thin-film resistor 46 is connected), respectively. Also, the heat dissipating portion 47 is provided to integrally continue to cover parts of upper parts of the paired insulating protecting layers 45, that is, upper parts of parts located on sides on which the paired insulating protecting layers 45 are opposed, and an upper part of the third synthetic resin layer 42c located between the paired insulating protecting layers 45. Accordingly, the heat dissipating portion 47 can be formed broadly in the resistor longitudinal direction while preventing the connecting electrodes 44c and the heat dissipating portion 47 from contacting and shorting.

Meanwhile, exposed parts of the connecting electrodes 44c uncovered with the insulating protecting layers 45 can be used as connecting parts to a test apparatus at the time of testing electrical characteristics of the thin-film resistor 46 during and after manufacturing the probe card 10.

The pedestal portion 48 is formed on the first synthetic resin layer 42a and is covered with the second synthetic resin layer 42b. The pedestal portion 48 is located on a lower side of the thin-film resistor 46, which is an opposite side of the heat dissipating portion 47, and is formed to be parallel to the thin-film resistor 46 via the second synthetic resin layer 42b. The pedestal portion 48 is thus surrounded by and buried in the first synthetic resin layer 42a and the second synthetic resin layer 42b. The pedestal portion 48 is made of a metal material such as Au, Cu, Ni, and Ag, which is a metal material having a smaller linear expansion coefficient than those of the synthetic resin layers (the second synthetic resin layer 42b and the third synthetic resin layer 42c) surrounding the thin-film resistor 46 and having higher heat conductivity than those of the synthetic resin layers. In the embodiment of the present invention, the pedestal portion 48 functions as a GND layer as well, is formed in a solid pattern, and is formed in a broad range, such as an approximately entire surface, of the insulating plate 41. For this reason, the plurality of thin-film resistors 46 can be arranged via the second synthetic resin layer 42b over one pedestal portion 48. Also, in a case in which the pedestal portion 48 is formed in the broad range of the insulating plate 41 such as in the solid pattern, the pedestal portion 48 contributes to heat dissipation.

The heat dissipation and pedestal connecting portions 49 are members connecting the heat dissipating portion 47 to the pedestal portion 48 to enable heat conduction and are adapted to transfer to the heat dissipating portion 47 heat transferred from the insulating plate 41, particularly, the second synthetic resin layer 42b and the third synthetic resin layer 42c surrounding the thin-film resistor 46, to the pedestal portion 48 and transfer heat transferred to the heat dissipation and pedestal connecting portions 49 themselves to the heat dissipating portion 47 and the pedestal portion 48. For example, the heat dissipation and pedestal connecting portions 49 are made of metal materials having high heat conductivity such as Au, Cu, Ni, and Ag. The heat dissipation and pedestal connecting portions 49 are located between the heat dissipating portion 47 and the pedestal portion 48 on the lateral sides of the thin-film resistor 46, penetrate the second synthetic resin layer 42b and the third synthetic resin layer 42c in the up-down direction, are coupled with the lower surface of the heat dissipating portion 47 at upper ends thereof, and are coupled with the upper surface of the pedestal portion 48 at lower ends thereof.

The heat dissipation and pedestal connecting portions 49 are fixed to and buried in the second synthetic resin layer 42b and the third synthetic resin layer 42c surrounding the heat dissipation and pedestal connecting portions 49.

As illustrated in FIG. 2, each of the heat dissipation and pedestal connecting portions 49 is formed in a flat plate shape and is arranged to be parallel to the longitudinal direction of the thin-film resistor 46 and perpendicular to the insulating plate 41. Heat dissipation and pedestal connecting portions 49a and 49b as one pair are provided on both sides of the thin-film resistor 46, and heat dissipation and pedestal connecting portions 49c and 49d as the other pair are provided on both sides of the heat dissipation and pedestal connecting portions 49a and 49b further outside than the heat dissipation and pedestal connecting portions 49a and 49b. In the embodiment of the present invention, the plurality of heat dissipation and pedestal connecting portions 49 are formed to have equal widths in the resistor longitudinal direction and are arranged at regular intervals, centering on the thin-film resistor 46.

In this manner, since the heat dissipation and pedestal connecting portions 49 are provided along the longitudinal direction of the thin-film resistor 46, heat generated from the thin-film resistor 46 can efficiently be transferred to the heat dissipating portion 47 and the pedestal portion 48. Also, since the heat dissipation and pedestal connecting portions 49 are provided as the pairs on both the sides of the thin-film resistor 46, heat generated from the thin-film resistor 46 can be transferred from both the sides to the heat dissipating portion 47 and the pedestal portion 48, and excessive stresses can be prevented from being generated in the insulating plate 41. Providing the heat dissipation and pedestal connecting portions to have equal distances from the thin-film resistor 46 to both the sides enables heat to be transferred evenly on both the sides, which is more preferable.

In this manner, in the probe card 10 according to the embodiment of the present invention, the heat dissipating portion 47, the pedestal portion 48, and the heat dissipation and pedestal connecting portions 49 constituting a heat dissipating mechanism are provided to surround the lateral sides of the thin-film resistor 46 and are coupled by the heat dissipation and pedestal connecting portions 49. Thus, heat generated from the thin-film resistor 46 can be transferred to the heat dissipating portion 47, the pedestal portion 48, and the heat dissipation and pedestal connecting portions 49 and can be dissipated from the heat dissipating portion 47 and the pedestal portion 48 coupled by the heat dissipation and pedestal connecting portions 49. Accordingly, heat can be restricted from accumulating in the insulating plate 41. Consequently, heat destruction of the insulating plate 41 can be prevented from occurring. Also, in a case in which the temperature does not reach the heat-resistant temperature of the insulating material, generation of excessive stresses in the thin-film resistor 46 due to influences of expansion caused by heating and contraction caused by cooling can be restricted, deterioration of the thin-film resistor 46 can be restricted, and breakage can be prevented.

Figure 3:
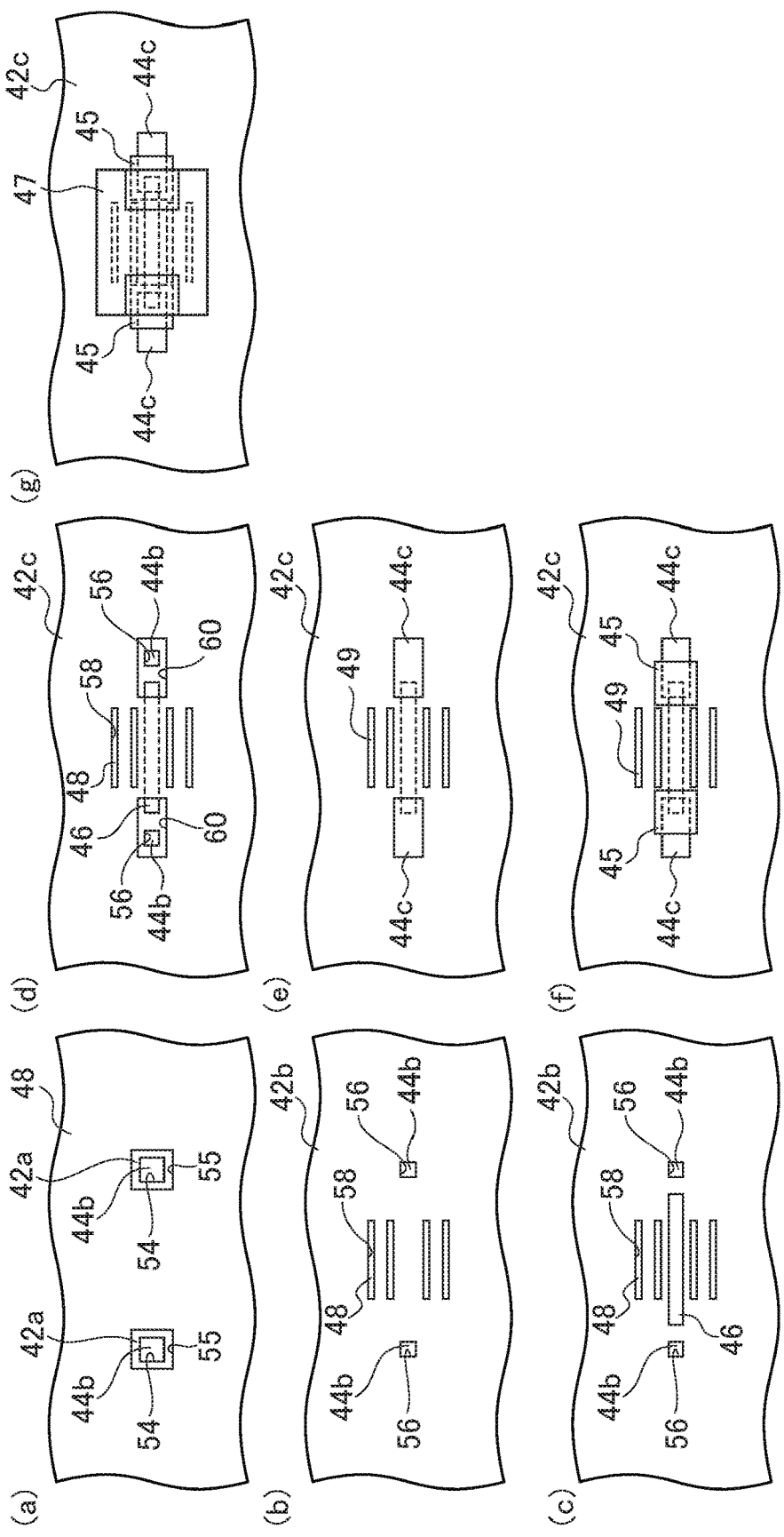
FIGS. 3(a) to 3(g) are partial plan views of the multilayer wiring base plate being manufactured illustrating a process for manufacturing the probe card illustrated in FIG. 2.

Hereinbelow, a process for manufacturing the probe card 10 will schematically be described with reference to FIG. 3. Here, in a process for forming the multilayer wiring base plate 38, a process for forming the heat dissipating structure burying layer 42 and subsequent processes will be described.

As illustrated in FIG. 3(a), after one or a plurality of insulating layer(s) located further on a lower side than the heat dissipating structure burying layer 42 is/are formed on the aforementioned ceramic plate 36, a polyimide resin material, for example, is applied on the uppermost insulating layer, and the first synthetic resin layer 42a is formed by means of heat curing. Subsequently, via holes 54 corresponding to wiring paths formed in the lower insulating layer are formed at predetermined positions of the first synthetic resin layer 42a. A wiring metal material is then deposited on the first synthetic resin layer 42a by means of plating, for example.

The wiring metal material fills the via holes 54 and is deposited on the first synthetic resin layer 42a to have an approximately uniform thickness by means of the plating. Subsequently, an unnecessary deposition material is eliminated by means of photolithography and etching to cause the pair of via wiring paths 44a and the wiring paths 44b on the via wiring paths to be formed and cause the pedestal portion 48 to be formed. At this time, recesses 55 are formed around the wiring paths 44b.

Meanwhile, instead of the method with use of the etching, the via wiring paths 44a, the wiring paths 44b, and the pedestal portion 48 can be formed by selectively depositing the wiring metal material at predetermined positions by means of plating with use of a predetermined mask.

Subsequently, as illustrated in FIG. 3(b), the second synthetic resin layer 42b is formed on the first synthetic resin layer 42a to fill the recesses 55 and cover the wiring paths 44b and the pedestal portion 48 in a similar manner to the first synthetic resin layer 42a. The second synthetic resin layer 42b is fixed to the pedestal portion 48 and surrounds the pedestal portion 48 in cooperation with the first synthetic resin layer 42a, which is the lower layer. In the second synthetic resin layer 42b, openings 56 opened over the wiring paths 44b and openings 58 opened over the pedestal portion 48 are formed.

As illustrated in FIG. 3(c), after formation of the openings 56 and the openings 58, a metal material for the thin-film resistor 46 is deposited on the second synthetic resin layer 42b. An unnecessary metal material is then eliminated with use of an etching mask or the like to cause the thin-film resistor 46 having a predetermined resistance value to be formed to be fixed to the second synthetic resin layer 42b. At this time, since the metal material deposited in the openings 56 and the openings 58 of the second synthetic resin layer 42b is eliminated as well, the openings 56 and the openings 58 are empty.

As illustrated in FIG. 3(d), the third synthetic resin layer 42c is formed on the second synthetic resin layer 42b to cover the thin-film resistor 46. In the third synthetic resin layer 42c, recesses 60 for the pair of connecting electrodes 44c are formed with use of photolithography and etching. In the recesses 60, the openings 56 of the second synthetic resin layer 42b are opened. Also, in the recesses 60, end portions of the thin-film resistor 46 are exposed over the entire widths thereof.

Thereafter, a wiring metal material for the connecting electrodes 44c is deposited on the third synthetic resin layer 42c to fill the openings 56 and the recesses 60, and an unnecessary wiring metal material on the third synthetic resin layer 42c is eliminated with use of photolithography and etching to cause the pair of connecting electrodes 44c coupled with and supported by the via wiring paths 44a via the wiring paths 44b to be formed as illustrated in FIG. 3(e). At this time, the paired connecting electrodes 44c are formed to be one size larger than the openings of the recesses 60 and to project upward from the third synthetic resin layer 42c.

In addition, a highly heat-conductive metal material is deposited on the third synthetic resin layer 42c to fill the openings 58, and an unnecessary metal material on the third synthetic resin layer 42c is eliminated with use of photolithography and etching to cause the heat dissipation and pedestal connecting portions 49 to be formed in a state of being connected to the pedestal portion 48 as illustrated in FIG. 3(e).

Meanwhile, instead of the method with use of the etching, the paired connecting electrodes 44c can be formed by selectively depositing the metal material for the paired connecting electrodes 44c at predetermined positions by means of plating with use of a predetermined mask, in a similar manner to what has been described with reference to FIG. 3(a).

In any of the aforementioned methods, since the wiring material deposited in the recesses 60 is deposited along the end portions of the thin-film resistor 46 exposed in the recesses 60, the paired connecting electrodes 44c are provided with the step portions 50, and the step portions 50 contact the corresponding end portions of the thin-film resistor 46. As a result, the paired connecting electrodes 44c are reliably connected to the thin-film resistor 46. Also, since the wiring material is deposited to cover the circumferential edges of the openings of the recesses 60, the paired connecting electrodes 44c are provided with the step portions 51, and the step portions 51 are coupled with the third synthetic resin layer 42c with large contact areas.

As illustrated in FIG. 3(f), both inside parts of the paired connecting electrodes 44c are covered with an electrical insulating material such as a polyimide synthetic resin material to cause the insulating protecting layers 45 to be formed. At this time, both outside parts of the paired connecting electrodes 44c are exposed.

Subsequently, as illustrated in FIG. 3(g), a highly heat-conductive metal material for the heat dissipating portion 47 is deposited on the third synthetic resin layer 42c and on the insulating protecting layers 45, that is, to cover both inside parts of the paired insulating protecting layers 45 and upper ends of the plurality of heat dissipation and pedestal connecting portions 49. An unnecessary metal material is eliminated with use of an etching mask or the like to cause the heat dissipating portion 47 to be fixed and formed on the third synthetic resin layer 42c and on the insulating protecting layers 45. At this time, to the upper ends of the heat dissipation and pedestal connecting portions 49, the heat dissipating portion 47 covering the upper ends is fixed and connected.

Modification Example 1

In the embodiment of the present invention, although the probe card 10 in which two pairs of heat dissipation and pedestal connecting portions 49 (49a, 49b, 49c, and 49d) are provided on both the lateral sides of the thin-film resistor 46 along the longitudinal direction of the thin-film resistor 46 has been illustrated and described, the present invention is not limited to this.

In Modification Example 1, the probe card 10 including the multilayer wiring base plate in which the heat dissipation and pedestal connecting portions provided on each side are connected to enable heat conduction will be illustrated and described.

FIG. 4(a) is a plan view of a part provided with one thin-film resistor of the multilayer wiring base plate 38 included in the probe card 10 according to Modification Example 1 of the present invention, and FIG. 4(b) is a cross-sectional view cut along the cross-section C-C' in FIG. 4(a).

As illustrated in FIGS. 4(a) and 4(b), the heat dissipation and pedestal connecting portions 49a and 49b parallel to the longitudinal direction of the thin-film resistor 46 and perpendicular to the insulating plate 41 are provided as one pair on both sides of the thin-film resistor 46, and the heat dissipation and pedestal connecting portions 49c and 49d are provided as the other pair further outside than the paired heat dissipation and pedestal connecting portions 49a and 49b.

A heat dissipation and pedestal connecting portion coupling portion 49e is provided to connect the heat dissipation and pedestal connecting portions 49a and 49c provided on one side or on one side of the thin-film resistor 46 to each other to enable heat conduction.

Similarly, a heat dissipation and pedestal connecting portion coupling portion 49f is provided to connect the heat dissipation and pedestal connecting portions 49b and 49d provided on the other side of the thin-film resistor 46 to each other to enable heat conduction.

The heat dissipation and pedestal connecting portion coupling portion 49f is made of a highly heat-conductive metal material such as Au, Cu, Ni, and Ag and is preferably formed integrally with the coupled heat dissipation and pedestal connecting portions with use of the same material as that for the heat dissipation and pedestal connecting portions 49a, 49b, 49c, and 49d.

In this manner, since plural pairs of heat dissipation and pedestal connecting portions 49 are provided on both the sides of the thin-film resistor 46 on a plane parallel to the insulating plate 41 along the longitudinal direction of the thin-film resistor 46, and the heat dissipation and pedestal connecting portions 49 provided on each side are connected, the temperatures of the heat dissipation and pedestal connecting portions 49 (49a, 49b, 49c, and 49d) are uniformed easily. Accordingly, generation of excessive stresses in the insulating plate 41 can further be prevented.

Figure 4:
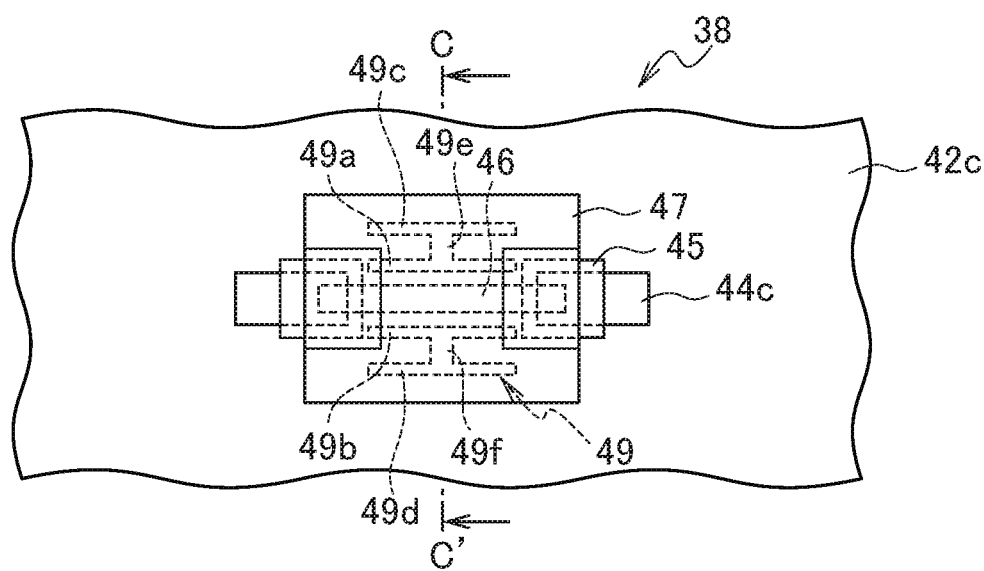
FIG. 4(a) is a partial plan view of the multilayer wiring base plate included in the probe card according to Modification Example 1 of the present invention.
FIG. 4(b) is a partial cross-sectional view cut along the cross-section C-C' in FIG. 4(a).
Figure 4:
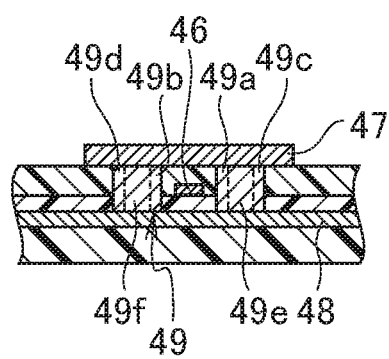
Figure 5:
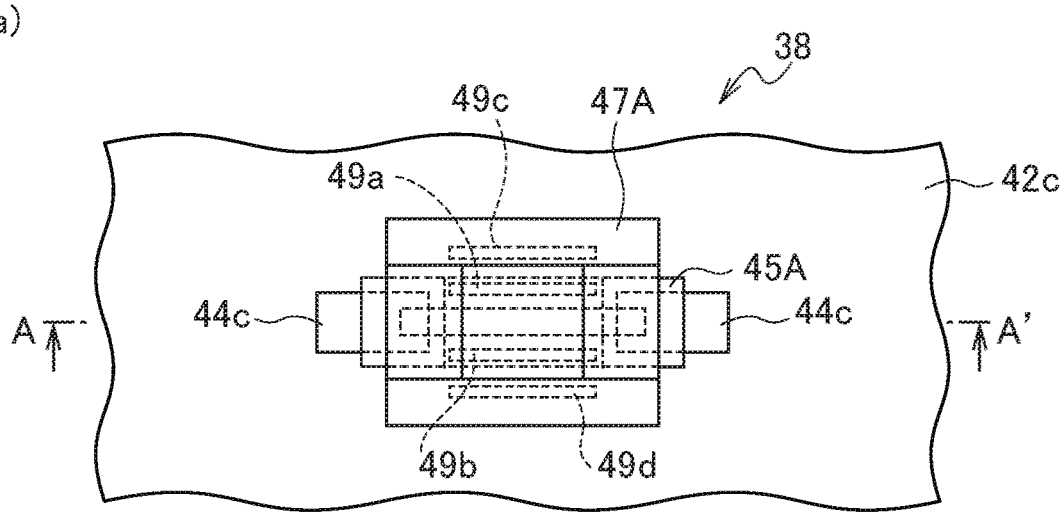
FIG. 5(a) is a partial plan view of the multilayer wiring base plate included in the probe card according to Modification Example 2 of the present invention.
FIG. 5(b) is a partial cross-sectional view cut along the cross-section A-A' in FIG. 5(a).
Figure 5:
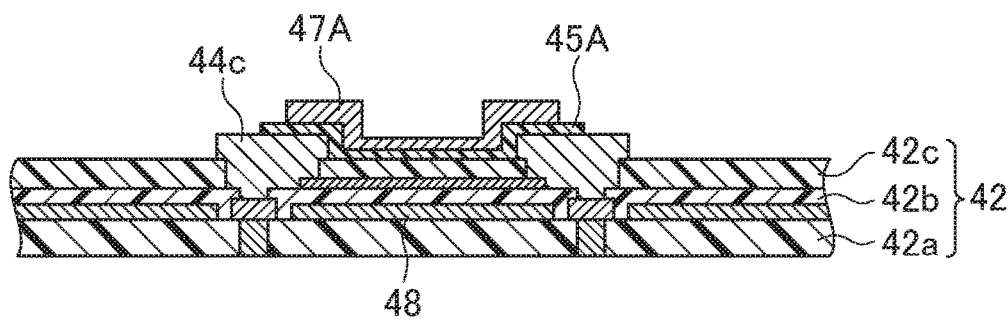
Figure 6:
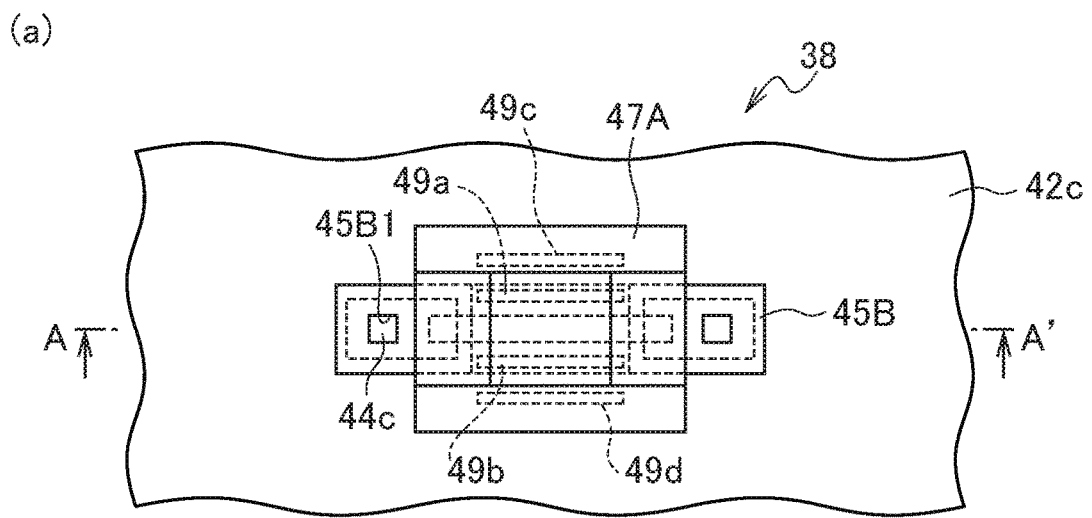
FIG. 6(a) is a partial plan view of the multilayer wiring base plate included in the probe card according to Modification Example 3 of the present invention.
FIG. 6(b) is a partial cross-sectional view cut along the cross-section A-A' in FIG. 6(a).
Figure 6:
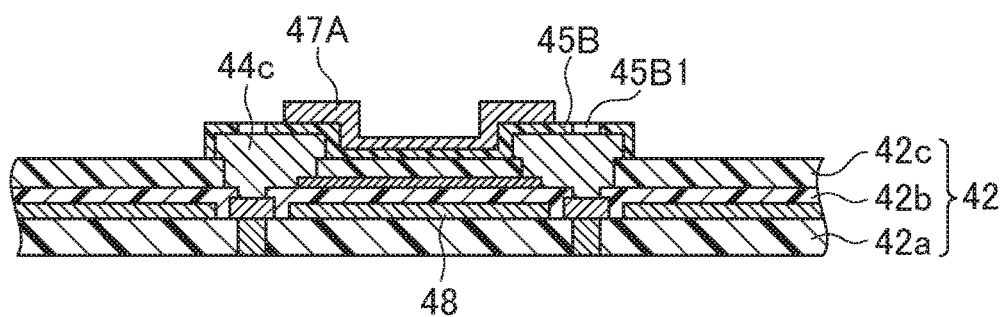
Figure 7:
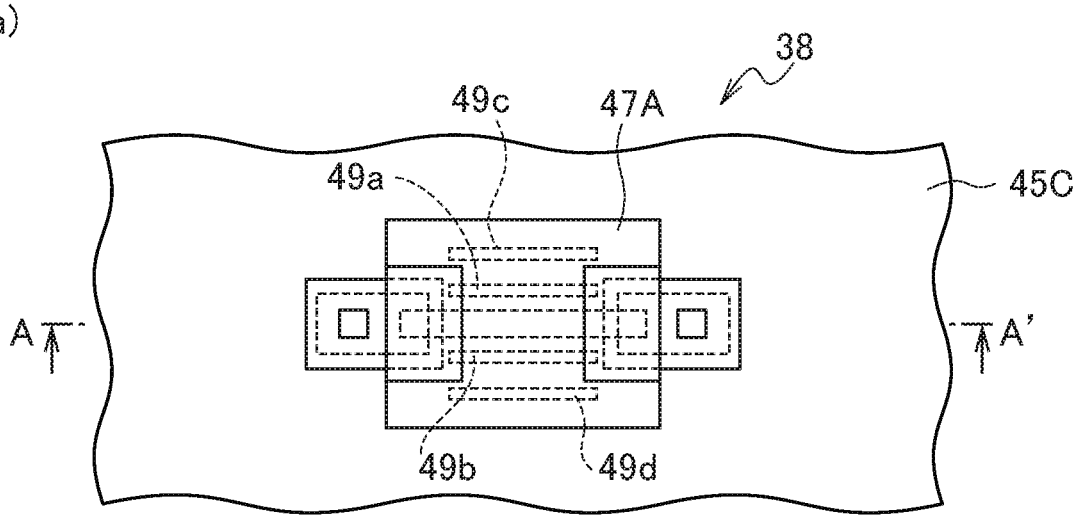
FIG. 7(a) is a partial plan view of the multilayer wiring base plate included in the probe card according to Modification Example 4 of the present invention.
FIG. 7(b) is a partial cross-sectional view cut along the cross-section A-A' in FIG. 7(a).
Figure 7:
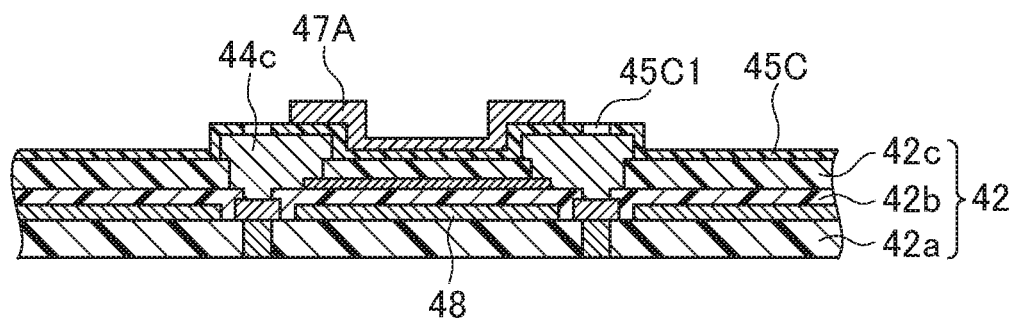

Meanwhile, in the modification example illustrated in FIG. 4, although each of the heat dissipation and pedestal connecting portion coupling portions 49e and 49f is provided for the two heat dissipation and pedestal connecting portions on each side, a plurality of heat dissipation and pedestal connecting portion coupling portions may be provided on each side. Also, although each of the heat dissipation and pedestal connecting portion coupling portions 49e and 49f is connected to have an entire height of each heat dissipation and pedestal connecting portion in a direction of the insulating plate thickness, one or a plurality of heat dissipation and pedestal connecting portion coupling portions may be connected to have a partial height on each side.

Modification Example 2

In the embodiment of the present invention, although the probe card 10 has been illustrated and described including the multilayer wiring base plate including the insulating protecting layers 45 provided to cover parts, that is, opposed inner parts, of the paired connecting electrodes 44c projecting from the insulating plate 41 and the heat dissipating portion 47 provided to cover the paired insulating protecting layers 45 and the third synthetic resin layer 42c provided between the paired insulating protecting layers 45 without contacting the paired connecting electrodes 44c, the present invention is not limited to this.

In Modification Example 2 of the present invention, the probe card 10 will be illustrated and described including the multilayer wiring base plate including an insulating protecting layer 45A provided to cover the parts of the paired connecting electrodes 44c projecting from the insulating plate 41 and the third synthetic resin layer 42c provided between the paired connecting electrodes 44c and a heat dissipating plate on the insulating protecting layer 45A. That is, Modification Example 2 is an example in which the paired connecting electrodes and the insulating plate therebetween are covered with the continuous insulating protecting layer, and in which the heat dissipating portion is formed on the insulating protecting layer.

FIG. 5(a) is a plan view of a part provided with one thin-film resistor of the multilayer wiring base plate 38 included in the probe card 10 according to Modification Example 2 of the present invention, and FIG. 5(b) is a cross-sectional view cut along the cross-section A-A' in FIG. 5(a).

As illustrated in FIGS. 5(a) and 5(b), the insulating protecting layer 45A is provided to cover both opposed inner sides of the paired connecting electrodes 44c projecting from the insulating plate 41 and an upper part of the insulating plate 41 between the paired connecting electrodes 44c. A heat dissipating portion 47A is provided on the insulating protecting layer 45A not to contact the paired connecting electrodes 44c. The heat dissipation and pedestal connecting portions 49 (49a and 49b) penetrate the insulating protecting layer 45A and are connected at upper ends thereof to the heat dissipating portion 47A, respectively, and the heat dissipation and pedestal connecting portions 49 (49c and 49d) are directly connected at upper ends thereof to the heat dissipating portion 47A, respectively.

Accordingly, since the insulating protecting layer 45A can be formed integrally, the insulating protecting layer 45A can be manufactured easily.

Modification Example 3

In Modification Example 3 of the present invention, the probe card 10 will be illustrated and described including the multilayer wiring base plate including an insulating protecting layer provided to cover the entireties of the paired connecting electrodes 44c projecting from the insulating plate 41 and the upper part of the insulating plate 41 between the paired connecting electrodes 44c.

FIG. 6(a) is a plan view of a part provided with one thin-film resistor of the multilayer wiring base plate 38 included in the probe card 10 according to Modification Example 3 of the present invention, and FIG. 6(b) is a cross-sectional view cut along the cross-section A-A' in FIG. 6(a).

As illustrated in FIGS. 6(a) and 6(b), an insulating protecting layer 45B is provided to cover the entireties of the paired connecting electrodes 44c projecting from the insulating plate 41 and the upper part of the insulating plate 41 between the paired connecting electrodes 44c. The heat dissipating portion 47A is provided on the insulating protecting layer 45B not to contact the paired connecting electrodes 44c. Also, at an upper part of the insulating protecting layer 45B, opening portions 45B1 are provided for a test of the connecting electrodes 44c such as measurement of resistance values.

The heat dissipation and pedestal connecting portions 49 (49a and 49b) penetrate the insulating protecting layer 45B and are connected at upper ends thereof to the heat dissipating portion 47A, respectively, and the heat dissipation and pedestal connecting portions 49 (49c and 49d) are directly connected at upper ends thereof to the heat dissipating portion 47A, respectively.

Accordingly, since the insulating protecting layer 45B can be formed integrally, the insulating protecting layer 45B can be manufactured easily.

Modification Example 4

In Modification Example 4 of the present invention, the probe card 10 will be illustrated and described including the multilayer wiring base plate including an insulating protecting layer provided to cover the entirety of the upper part of the insulating plate 41 and the entireties of the paired connecting electrodes 44c projecting from the insulating plate 41 and the heat dissipating plate on the insulating protecting layer.

FIG. 7(a) is a plan view of the multilayer wiring base plate 38 included in the probe card 10 according to Modification Example 4 of the present invention, and FIG. 7(b) is a cross-sectional view cut along the cross-section A-A' in FIG. 7(a).

As illustrated in FIGS. 7(a) and 7(b), an insulating protecting layer 45C is provided to cover the entirety of the upper part of the insulating plate 41 and the entireties of the paired connecting electrodes 44c projecting from the insulating plate 41. The heat dissipating portion 47A is provided on the insulating protecting layer 45C not to contact the paired connecting electrodes 44c. Also, at an upper part of the insulating protecting layer 45C, opening portions 45C1 are provided for a test of the connecting electrodes 44c such as measurement of resistance values.

The heat dissipation and pedestal connecting portions 49 (49a, 49b, 49c, and 49d) penetrate the insulating protecting layer 45C and are connected at upper ends thereof to the heat dissipating portion 47A, respectively.

Accordingly, since the insulating protecting layer 45C can be formed integrally, the insulating protecting layer 45C can be manufactured easily.

Modification Example 5

In the embodiment of the present invention, the probe card 10 has been illustrated and described including the multilayer wiring base plate 38 including between the second synthetic resin layer 42b and the third synthetic resin layer 42c the pedestal portion 48 functioning as a GND (ground) layer and formed in a solid pattern, and a case in which the plurality of thin-film resistors are arranged over one pedestal portion has been illustrated and described.

In Modification Example 5 of the present invention, the probe card 10 including the multilayer wiring base plate in which a pedestal portion is buried and formed in an independent pattern will be illustrated and described.

Figure 8:
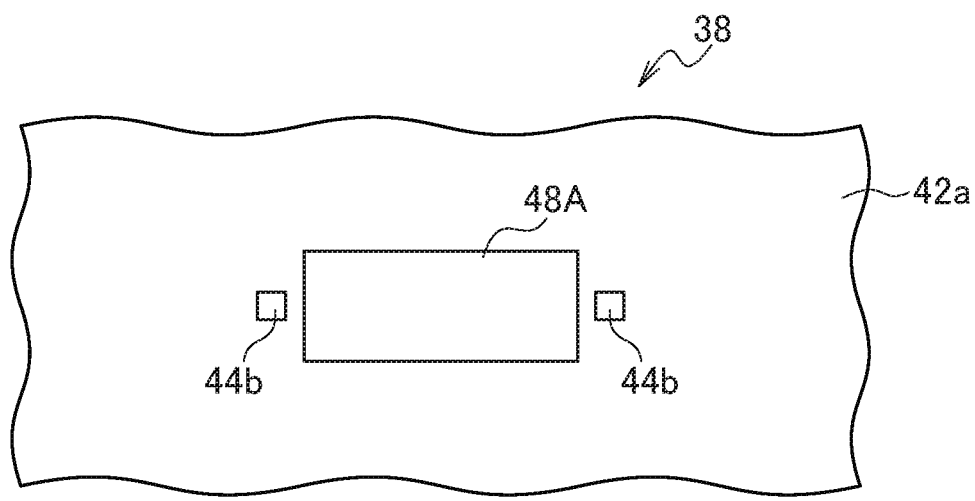
FIG. 8 is a partial plan view of the multilayer wiring base plate being manufactured included in the probe card according to Modification Example 5 of the present invention and illustrates a process for forming a pedestal portion on the first synthetic resin layer.

FIG. 8 is a partial front view of the multilayer wiring base plate 38 included in the probe card 10 according to Modification Example 5 of the present invention after formation of a pedestal portion. This figure describes a part corresponding to the process in FIG. 3(a) in the manufacturing process according to the embodiment of the present invention.

As illustrated in FIG. 8, the probe card 10 according to Modification Example 5 of the present invention includes a pedestal portion 48A in an independent pattern not connected to the GND (ground) and buried and formed between the second synthetic resin layer 42b and the third synthetic resin layer 42c. This modification example is similar to the embodiment of the present invention except that the pedestal portion is in the independent pattern. Although the shape of the pedestal portion 48A does not matter as long as the pedestal portion 48A is located on a lower side of the thin-film resistor 46 and is located on lower sides of the heat dissipation and pedestal connecting portions 49 to enable connection to the heat dissipation and pedestal connecting portions 49, the pedestal portion 48A is more preferably larger in area than the thin-film resistor 46 on a plane parallel to the insulating plate 41 since enlarging the area improves a heat diffusion effect.

Modification Example 6

In Modification Example 6 of the present invention, the probe card 10 including the multilayer wiring base plate 38 in which one heat dissipating portion is provided for a plurality of thin-film resistors 46 will be illustrated and described.

Figure 9:
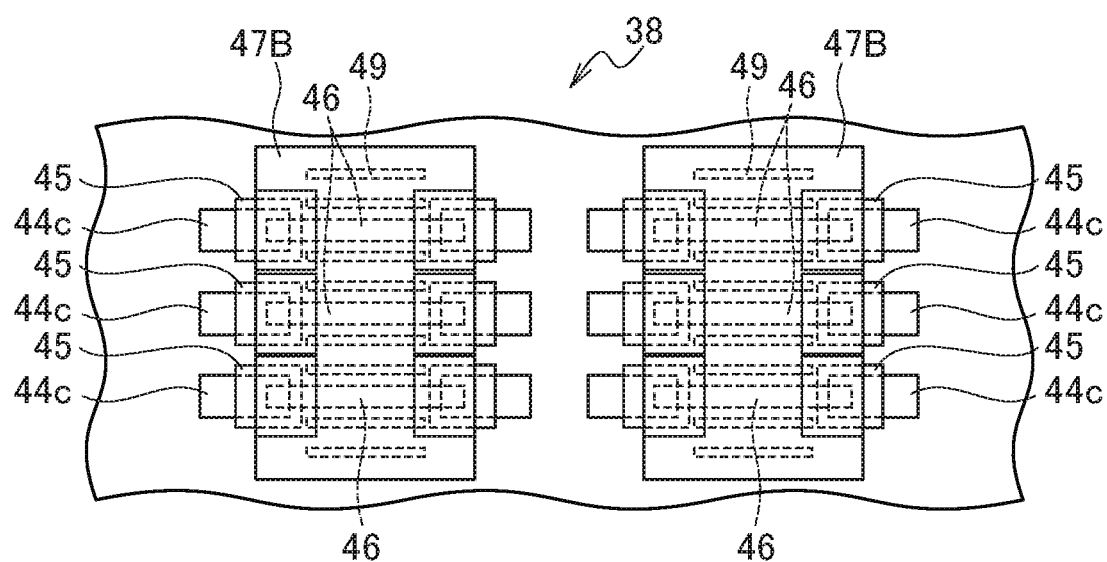
FIG. 9 is a partial plan view of the multilayer wiring base plate included in the probe card according to Modification Example 6 of the present invention.

FIG. 9 is a partial plan view of the multilayer wiring base plate 38 included in the probe card 10 according to Modification Example 6 of the present invention.

As illustrated in FIG. 9, in a case in which the pair of via wiring paths 44a, the pair of wiring paths 44b, the pair of connecting electrodes 44c, and the thin-film resistor 46 illustrated in FIG. 2 are regarded as a set of resistance electrical paths, the multilayer wiring base plate 38 included in the probe card 10 according to Modification Example 6 of the present invention includes plural sets of resistance electrical paths. In FIG. 9, as for the plural sets of resistance electrical paths, two columns in each of which three sets of resistance electrical paths are arrayed in parallel with each other with the positions thereof in a longitudinal direction of the thin-film resistors 46 aligned are arranged side by side in the resistor longitudinal direction.

On the lateral sides of each set of resistance electrical paths in each column, two pairs of heat dissipation and pedestal connecting portions are arranged with the thin-film resistor 46 interposed therebetween, in a similar manner to the embodiment of the present invention. Since the heat dissipation and pedestal connecting portions located between the adjacent sets of resistance electrical paths are shared by the adjacent sets of resistance electrical paths, two heat dissipation and pedestal connecting portions are arranged between the adjacent sets of resistance electrical paths.

In each column, a heat dissipating portion 47B is provided to cover the insulating plate 41, the plural pairs of insulating protecting layers 45, and the plural pairs of heat dissipation and pedestal connecting portions 49.

Accordingly, even in a case in which the insulating plate 41 is provided with plural sets each including the pair of via wiring paths 44a, the pair of wiring paths 44b, the pair of connecting electrodes 44c, the insulating protecting layers 45, the thin-film resistor 46, the pedestal portion 48, and the heat dissipation and pedestal connecting portions 49, the heat dissipating portion 47B is provided to cover these. Consequently, the temperature of the insulating plate 41 is prevented from locally increasing and can be uniformed as much as possible. Accordingly, generation of excessive stresses in the insulating plate 41 can further be prevented.

Meanwhile, the heat dissipating portions 47B provided in the respective columns may be connected.

The present invention is not limited to the embodiment and the modification examples described above. For example, as wiring metal materials for the via wiring path 44a, the wiring path 44b, the connecting electrode 44c, the pedestal portion 48, the heat dissipation and pedestal connecting portion 49, and the like, various metal materials may be used instead of the aforementioned examples. Also, the thin-film resistor can arbitrarily be made of a metal material such as a Cr—Pd alloy, a Ti—Pd alloy, tantalum oxide, tantalum nitride, a Cr simple substance, and a Ti simple substance instead of the aforementioned Ni—Cr alloy.

Each of the synthetic resin layers of the multilayer wiring base plate can be made of various insulating synthetic resin materials instead of the aforementioned polyimide synthetic resin layer and polyimide synthetic film.

Also, although the two pairs of heat dissipation and pedestal connecting portions 49 are provided at regular intervals on the lateral sides of the thin-film resistor 46 to have equal widths in the description of the embodiment and the modification examples of the present invention, only one pair or three pairs or more may be formed. Also, the distance between the adjacent heat dissipation and pedestal connecting portions 49 and the distance between the thin-film resistor 46 and the heat dissipation and pedestal connecting portion 49 may differ from each other. The width of each heat dissipation and pedestal connecting portion 49 may differ from each other. The number of the heat dissipation and pedestal connecting portions 49 and the distance and the width of each heat dissipation and pedestal connecting portion 49 may differ between both the lateral sides of the thin-film resistor 46. By adjusting such conditions, heat dissipation performance can be set finely.

Also, although the external shape of the heat dissipating portion 47 in a planar view is rectangular in the description of the embodiment and the modification examples of the present invention, the shape can be an arbitrary shape as long as the heat dissipating portion 47 can be coupled with the heat dissipation and pedestal connecting portions without contacting the connection electrodes 44c and can be arranged over the thin-film resistor 46.

Also, in the test system 1 according to the present invention, although the probe card 10 is connected to the tester 32, another electrical connector (board) may be interposed between the probe card 10 and the tester 32. Also, the multilayer wiring base plate according to the present invention may be applied to an electrical connector other than the probe card arranged on the electrical paths between the tester 32 and the probes 40.

Meanwhile, in the above embodiment, although one thin-film resistor 46 and the structure of the peripheral part thereof have been illustrated in the figures and described, the number of the thin-film resistors 46 may not only be one but also be plural.

INDUSTRIAL APPLICABILITY

The present invention can be used for a multilayer wiring base plate incorporating a thin-film resistor and a probe card using the multilayer wiring base plate.

REFERENCE SIGNS LIST

10 probe card
22 probe base plate
38 multilayer wiring base plate
40 probe
41 insulating plate
42 (42*a*, 42*b*, 42*c*) heat dissipating structure burying layer (first synthetic resin layer, second synthetic resin layer, third synthetic resin layer)
44*a* via wiring path
44*b* wiring path
44*c* connecting electrode
45 insulating protecting layer
46 thin-film resistor
47 heat dissipating portion
48 pedestal portion
49 heat dissipation and pedestal connecting portion

The invention claimed is:

1. A multilayer wiring base plate provided on a wiring path between a tester and a probe, comprising:
   an insulating plate including a plurality of insulating synthetic resin layers;
   a wiring circuit provided in the insulating plate;
   at least one thin-film resistor formed to be buried in the insulating plate and electrically connected to the wiring circuit;
   a heat dissipating portion provided over one surface of the insulating plate to be opposed to the thin-film resistor via a part of the plurality of insulating synthetic resin layers and having higher heat conductivity than that of the insulating plate;
   a pedestal portion formed to be buried in the insulating plate and provided to be opposed to the thin-film resistor via a part of the plurality of insulating synthetic resin layers on an opposite side of the heat dissipating portion and having higher heat conductivity than that of the insulating plate;
   at least one heat dissipation and pedestal connecting portion connecting the heat dissipating portion to the pedestal portion on a lateral side of the thin-film resistor, provided to be buried in the insulating plate, and having higher heat conductivity than that of the insulating plate;
   paired connecting electrodes connected to both ends of the thin-film resistor and provided to at least partially project from the insulating plate; and
   insulating protecting layers provided to cover at least parts of the paired connecting electrodes projecting from the insulating plate,
   wherein the heat dissipating portion is provided to cover the insulating protecting layers and a surface of the insulating plate located between the insulating protecting layers without contacting the paired connecting electrodes.

2. The multilayer wiring base plate according to claim 1, wherein the heat dissipation and pedestal connecting portion is provided along a longitudinal direction of the thin-film resistor.

3. The multilayer wiring base plate according to claim 2, wherein the plurality of heat dissipation and pedestal connecting portions are provided on both lateral sides of the thin-film resistor with the thin-film resistor interposed therebetween.

4. The multilayer wiring base plate according to claim 3, wherein the plurality of heat dissipation and pedestal connecting portions provided at least on one lateral side of the thin-film resistor are connected.

5. The multilayer wiring base plate according to claim 1, wherein the plurality of thin-film resistors are provided,
   wherein the heat dissipating portion is provided to be opposed to the plurality of thin-film resistors, and
   wherein the heat dissipating portion and the pedestal portion are connected by the plurality of heat dissipation and pedestal connecting portions.

6. A probe card comprising the multilayer wiring base plate according to claim 1.

7. A multilayer wiring base plate provided on a wiring path between a tester and a probe, comprising:
   an insulating plate including a plurality of insulating synthetic resin layers;
   a wiring circuit provided in the insulating plate;
   at least one thin-film resistor formed to be buried in the insulating plate and electrically connected to the wiring circuit;
   a heat dissipating portion provided over one surface of the insulating plate to be opposed to the thin-film resistor via a part of the plurality of insulating synthetic resin layers and having higher heat conductivity than that of the insulating plate;
   a pedestal portion formed to be buried in the insulating plate and provided to be opposed to the thin-film resistor via a part of the plurality of insulating synthetic resin layers on an opposite side of the heat dissipating portion and having higher heat conductivity than that of the insulating plate;
   at least one heat dissipation and pedestal connecting portion connecting the heat dissipating portion to the pedestal portion on a lateral side of the thin-film resistor, provided to be buried in the insulating plate, and having higher heat conductivity than that of the insulating plate;
   paired connecting electrodes connected to both ends of the thin-film resistor and provided to at least partially project from the insulating plate; and
   an insulating protecting layer provided to cover at least a part of each of the paired connecting electrodes projecting from the insulating plate and a surface of the insulating plate located between the paired connecting electrodes,
   wherein the heat dissipating portion is provided to cover the insulating protecting layer without contacting the paired connecting electrodes.

8. The multilayer wiring base plate according to claim 7, wherein the heat dissipation and pedestal connecting portion is provided along a longitudinal direction of the thin-film resistor.

9. The multilayer wiring base plate according to claim 8, wherein the plurality of heat dissipation and pedestal connecting portions are provided on both lateral sides of the thin-film resistor with the thin-film resistor interposed therebetween.

10. The multilayer wiring base plate according to claim 9, wherein the plurality of heat dissipation and pedestal connecting portions provided at least on one lateral side of the thin-film resistor are connected.

11. The multilayer wiring base plate according to claim 7, wherein the plurality of thin-film resistors are provided,
wherein the heat dissipating portion is provided to be opposed to the plurality of thin-film resistors, and
wherein the heat dissipating portion and the pedestal portion are connected by the plurality of heat dissipation and pedestal connecting portions.

12. A probe card comprising the multilayer wiring base plate according to claim 7.

* * * * *